United States Patent [19]

Tarui et al.

[11] Patent Number: 5,657,553

[45] Date of Patent: Aug. 19, 1997

[54] SUBSTRATE DRYING APPARATUS

[75] Inventors: Tetsuya Tarui, Osaka; Hiromitsu Asano, Nara; Hajime Onoda, Tokyo, all of Japan

[73] Assignees: Sharp Kabushiki Kaisha, Osaka; Kimmon Quartz Co., Ltd., Tokyo, both of Japan

[21] Appl. No.: 563,616

[22] Filed: Nov. 28, 1995

[30] Foreign Application Priority Data

Nov. 29, 1994 [JP] Japan .................................. 6-295277

[51] Int. Cl.$^6$ ...................................... F26B 21/06
[52] U.S. Cl. ........................... 34/78; 34/73; 34/468; 34/477
[58] Field of Search ................ 34/72–78, 467–470, 34/477

[56] References Cited

U.S. PATENT DOCUMENTS

| 4,393,657 | 7/1983 | Takatama ........................ 60/653 |
| 4,800,362 | 1/1989 | Sasaki et al. ..................... 34/78 |
| 4,822,429 | 4/1989 | McCord .......................... 134/12 |
| 5,315,766 | 5/1994 | Roberson, Jr. et al. ............. 34/409 |
| 5,369,891 | 12/1994 | Kamikawa ....................... 34/78 |
| 5,443,540 | 8/1995 | Kamikawa ....................... 34/471 |
| 5,539,995 | 7/1996 | Bran ............................ 34/77 |

*Primary Examiner*—Henry A. Bennett
*Assistant Examiner*—Dinnatia Doster
*Attorney, Agent, or Firm*—Mathews, Collins, Shepherd & Gould

[57] ABSTRACT

A substrate drying apparatus comprises a treatment vessel for containing IPA in the form of liquid, an IPA source for supplying IPA into the treatment vessel, a first heat exchanger which is equipped with a heat exchanger tube dipped in IPA and allowing steam to pass therein, the first heat exchanger allowing the steam and IPA to perform heat exchange therebetween to thereby evaporate IPA, and a second heat exchanger provided on or above an upper portion of the treatment vessel and equipped with a heat exchanger tube for allowing a coolant to pass therein, the second heat exchanger allowing the coolant and the evaporated IPA to perform heat exchange therebetween to thereby condense the evaporated IPA.

14 Claims, 5 Drawing Sheets

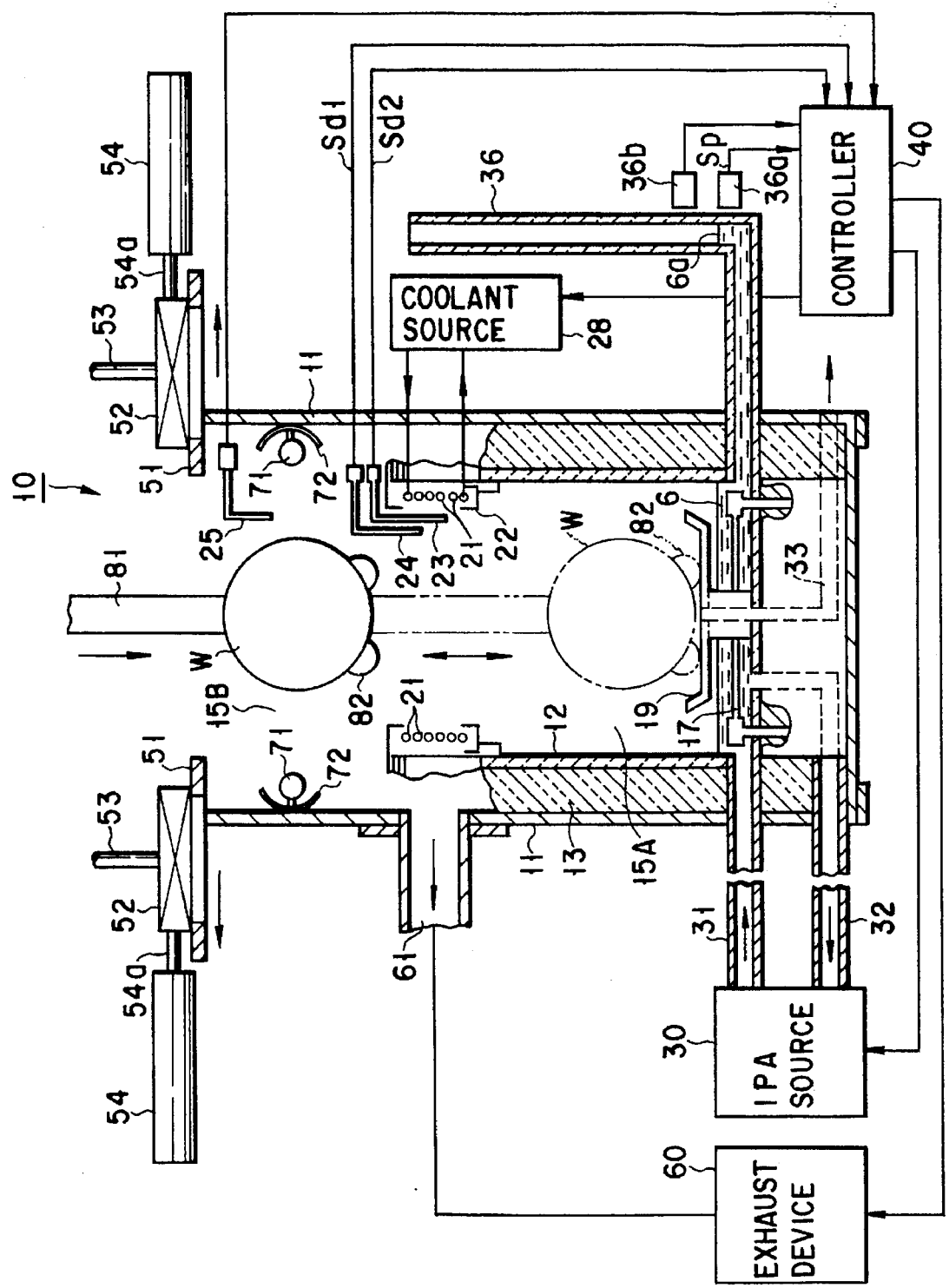
F I G. 1

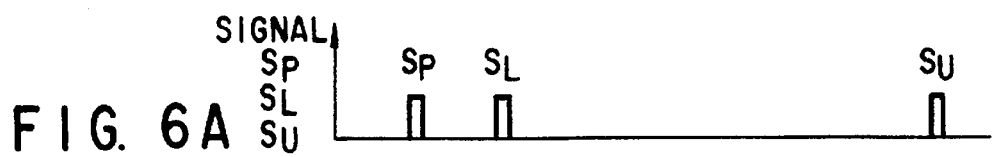
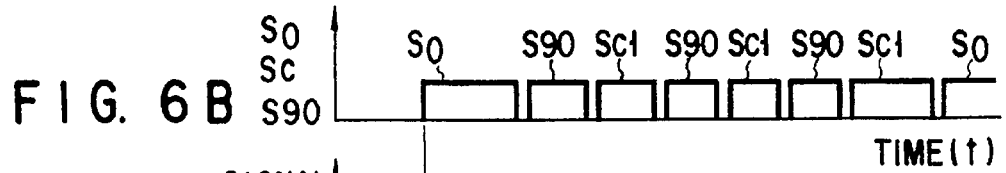
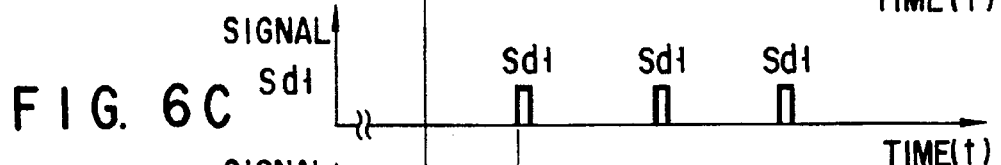
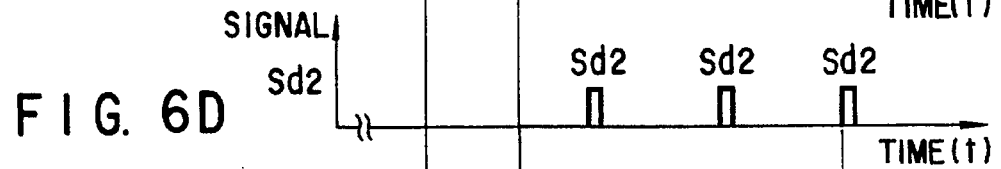
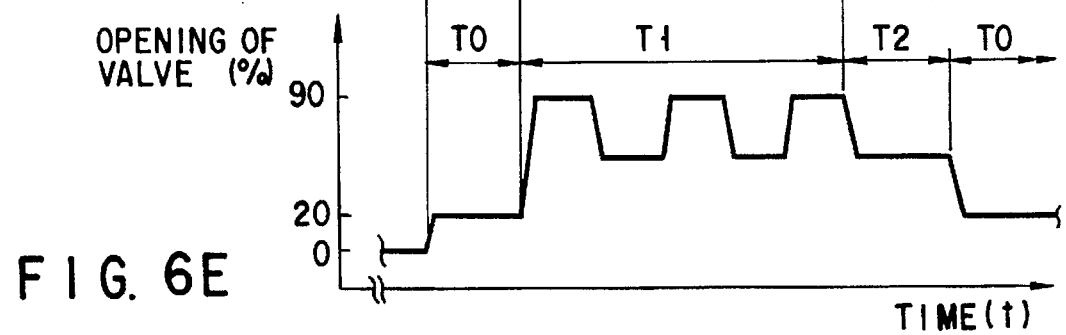
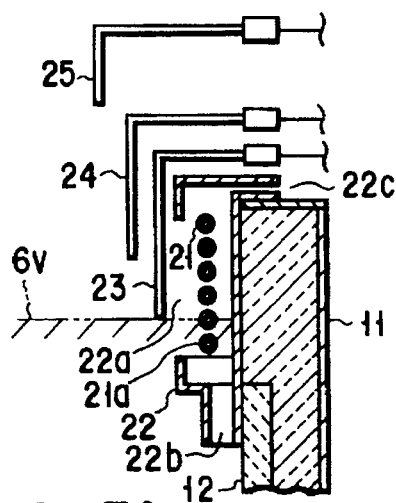
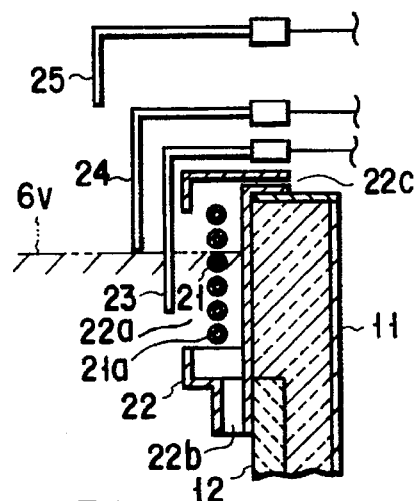

SUBSTRATE DRYING APPARATUS

BACKGROUND OF THE INVENTION

1. Field the Invention

This invention relates to a substrate drying apparatus for drying substrates, such as semiconductor wafers or LCD substrates, after the cleaning treatment thereof.

2. Description of the Related Art

In the manufacturing process of semiconductor devices, it is important to transfer wafers with no foreign materials to a place where they are next treated. Therefore, when each treatment has been finished, foreign materials, if any, are removed from the wafers to clean their surfaces. After the cleaning, the wafers are washed using ultrapure water, and then dried.

A vapor-using substrate drying apparatus is generally used to dry wafers since it can provide very cleaned wafers. In this apparatus, an organic solvent of a low boiling point, such as isopropyl alcohol (hereinafter referred to as "IPA") which has a boiling point of about 82° C., is heated and evaporated. Each wafer is exposed to the resultant vapor (IPA vapor), and moisture thereon is replaced with IPA. The wafer is then transferred to the outside of the treatment vessel, where IPA attached thereto is again evaporated. Thus, the vapor using apparatus can provide wafers with dry and clean surfaces which are free from contamination materials such as dirt particles or chemicals.

Further, the conventional substrate drying apparatus of the vapor-using type is equipped with an electric resistance type sheathed heater or a cartridge heater-embedded hot plate. The hot plate is generally attached to the outer surface of the bottom of the treatment vessel of the apparatus, to indirectly heat IPA contained in the vessel. This is because IPA has high inflammability and hence may easily cause a fire accident. In other words, it is prohibited for safety's sake to directly heat IPA in the treatment vessel by an electric heater. Moreover, in the conventional apparatus, the electric heater is set to have a low capacity to avoid generation of an excessive amount of IPA which may occur due to disorder of a control system for the heater.

In light of the above, in the conventional drying apparatus, the heater indirectly heats IPA with a quartz glass wall or a stainless steel wall interposed therebetween. Accordingly, the thermal conductivity and the thermal responsiveness are inevitably low. This means that a great amount of time is required, after the start of heating, to generate a sufficient amount of IPA vapor to perform the drying treatment, and therefore that a great number of wafers cannot safely and speedily be dried.

In addition, since a plurality of wafers are treated at a time in the cleaning and drying treatments, it is necessary to reduce the amounts of consumed energy and IPA. In the conventional apparatuses, however, the control system employed therein for controlling the amount of IPA vapor has only a low responsiveness. Therefore, the amount of vapor necessary for the drying treatment must be kept at all times, with the result that the consumption amounts of energy and IPA cannot greatly be reduced.

SUMMARY OF THE INVENTION

It is the object of the invention to provide a substrate drying apparatus capable of drying a multiple of substrates safely and speedily.

According to the invention, there is provided a substrate drying apparatus for drying a plurality of wet substrates at a time, comprising:

a treatment vessel for containing an organic solvent in the form of liquid and having a boiling point lower than water;

supply means for supplying the organic solvent into the treatment vessel;

a first heat exchanger equipped with a heat exchanger tube dipped in the organic solvent and allowing the heat medium to pass therein, the first heat exchanger allowing the heat medium and the organic solvent to perform heat exchange therebetween to thereby evaporate the organic solvent; and a second heat exchanger provided on or above an upper portion of the treatment vessel and equipped with a heat exchanger tube for allowing a coolant to pass therein, the second heat exchanger allowing the coolant and the evaporated organic solvent to perform heat exchange therebetween to thereby condense the evaporated organic solvent.

At the time of using IPA (having a boiling point of about 80°). as the organic solvent, saturated steam or supersaturated steam of a temperature falling within a range of 90°–150° ., preferably about 130° C., is used as the heat medium. Therefore, the drying apparatus is almost free from fire accidents and hence very safe.

Moreover, since the apparatus further comprises a flow adjusting mechanism, at least one temperature sensor and control means, the generation amount of the organic solvent vapor can be controlled promptly and easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a longitudinal cross sectional view, showing the overall substrate drying apparatus according to the embodiment of the invention;

FIGS. 6A to 6E are timing charts, showing the relationship between each signal and the valve opening or divergence of valve for explaining the operation of the IPA heating system; and FIGS. 7A and 7B are schematic cross sectional views, showing the upper limits of IPA vapor generating regions for explaining IPA heating control.

DETAILED DESCRIPTION OF THE PREFERRED EMBODIMENT

The preferred embodiment of the invention will be explained with reference with the accompanying drawings.

Figure 2:
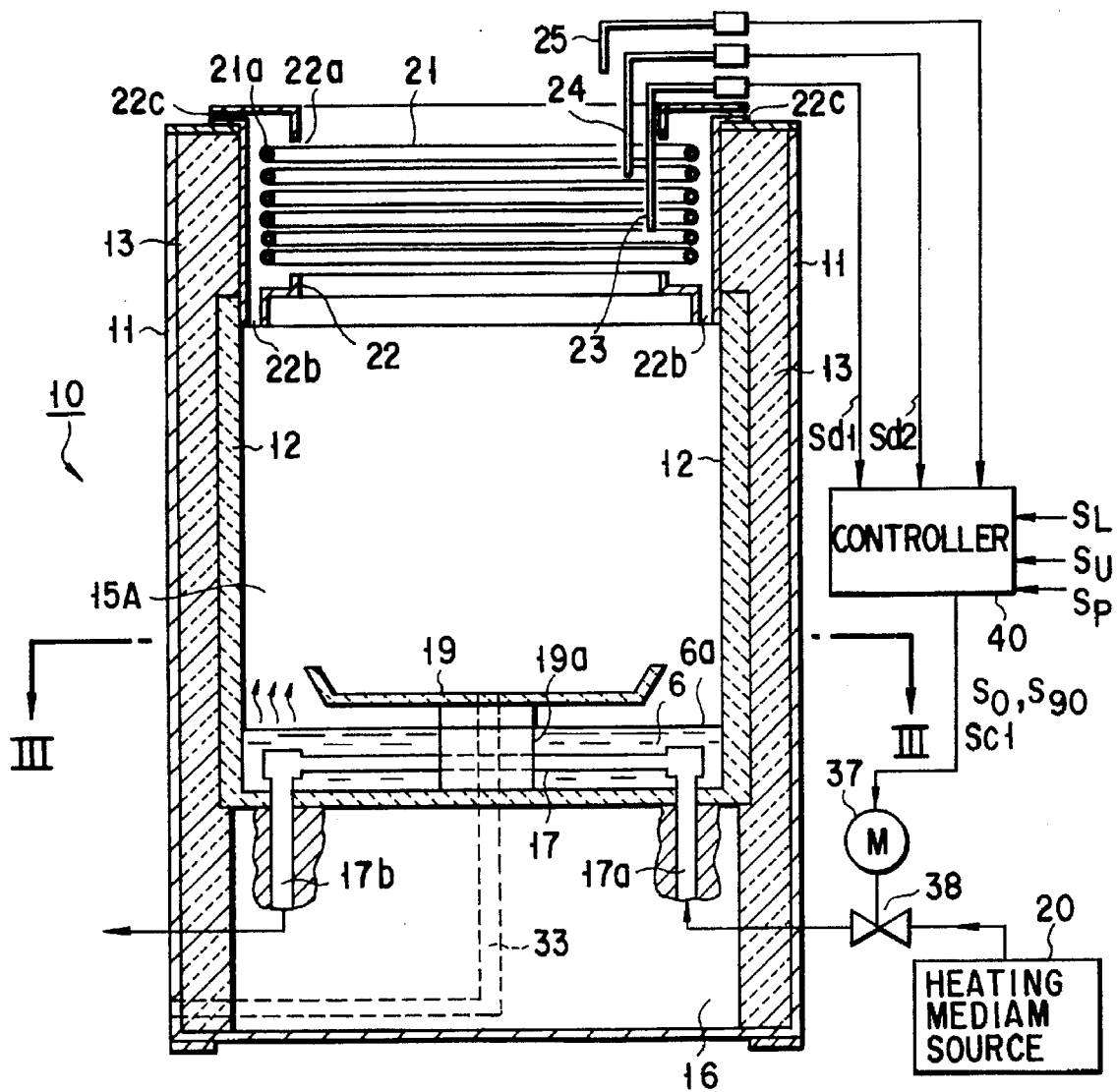
FIG. 2 is a cross sectional view, showing an essential part of the substrate drying apparatus of FIG. 1.
Figure 3:
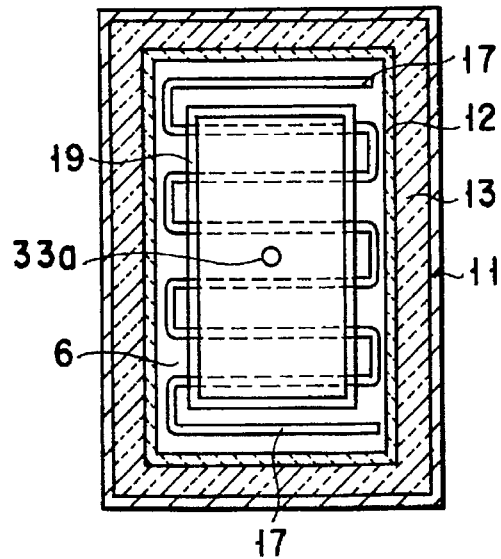
FIG. 3 is a cross sectional view, taken along lines III—III.
Figure 4:
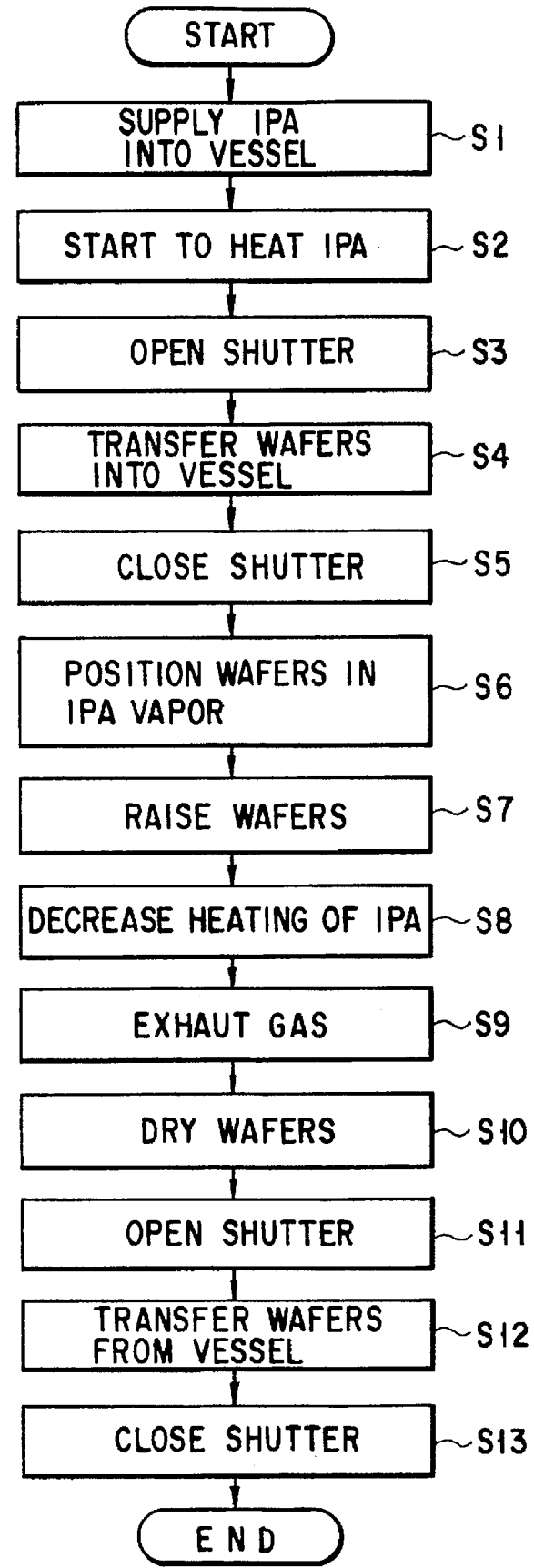
FIG. 4 is a flowchart, illustrating a method for drying a substrate.
Figure 5:
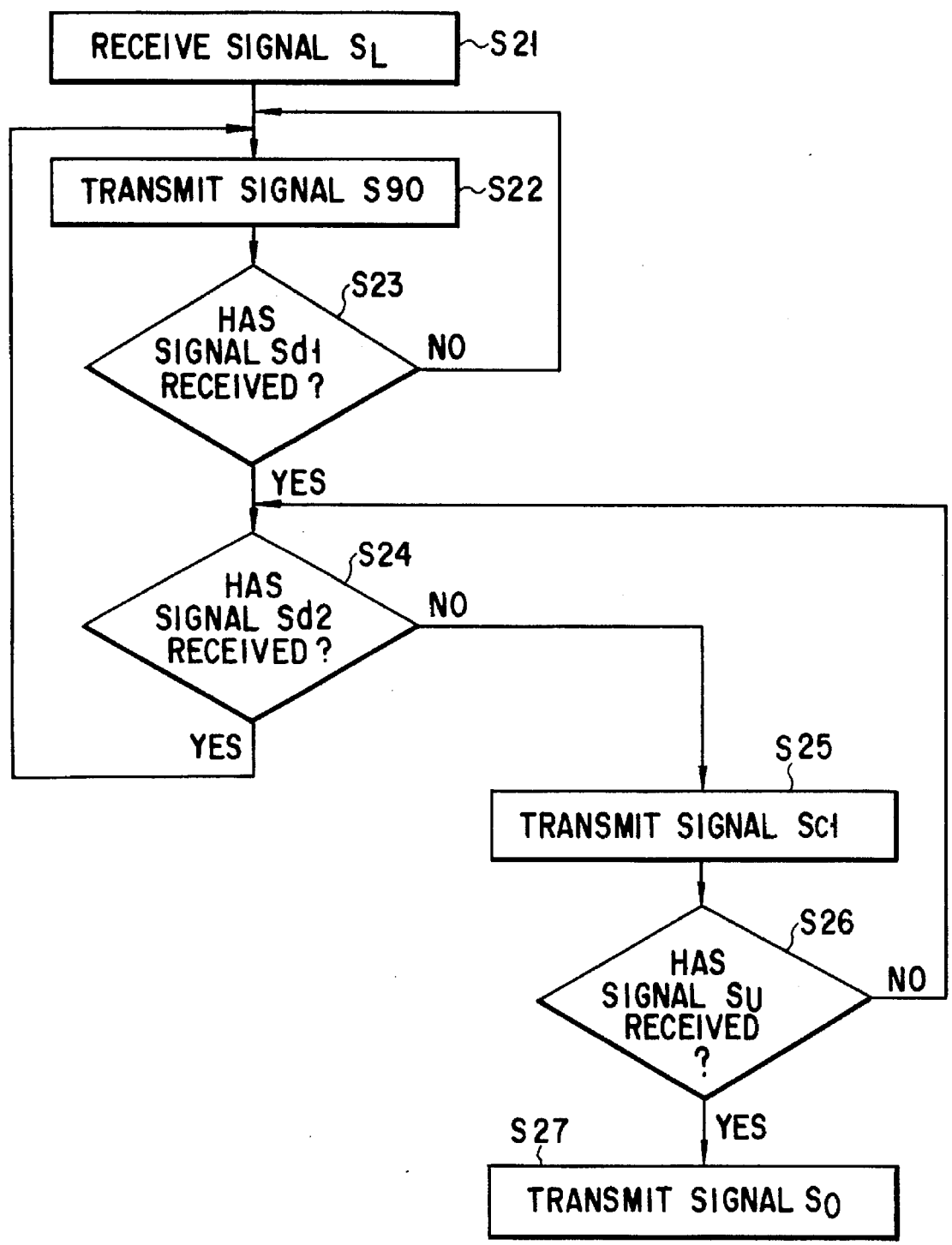
FIG. 5 is a flowchart, illustrating the operation of the controller of an IPA heating system.

As is shown in FIGS. 1 to 3, a substrate drying apparatus 10 has an outer treatment vessel 11 made of stainless steel, and an inner treatment vessel 12 made of quartz glass or stainless steel and received in the outer vessel 11. Liquid IPA 6 is contained in the inner vessel 12. Both the outer and inner vessels 11 and 12 are box-shaped which have upper openings. A heat insulator layer 13 is interposed between the vessels 11 and 12 for thermally isolating the vessel 12 from the vessel 11. Further, the vessel 12 is placed on a heat retaining table 16.

A pair of closable shutters 51 are provided on the upper openings of the outer vessel 11. Each shutter 51 has a filter 52 and an air inlet pipe 53 provided for introducing clean air therethrough into an upper space 15B in the outer vessel 11. The horizontal rod 54a of a cylinder 54 is coupled with each shutter 51 for allowing the shutter to horizontally slide.

A boat moving device (not shown) which supports a wafer boat 82 with its support rod 81 is provided above the apparatus 10 for vertically moving the boat 82. The boat 82 can contain 20 to 50 semiconductor wafers W obtained after being cleaned by a cleaning apparatus (not shown). The capacity of the substrate drying apparatus 10 is determined depending upon the diameter and the number of the wafers W. The wafer boat 82 is introduced into the apparatus 10 through the upper opening of the outer vessel 11, passed through the lower space 15B, and placed in a lower space 15A in the inner vessel 12. In the lower space 15A, IPA vapor is generated.

A pan 19 is provided on the inner surface of the bottom of the inner vessel 12 for receiving the wafer boat 82. The pan 19 is supported by a member 19a such that it is located above the surface 6a of liquid IPA 6. A hole 33 is formed in a substantially center portion of the pan 19 such that it communicates with an inner passage 33. The inner passage 13 communicates with an external collecting vessel (not shown).

An IPA source 30 has a supply pipe 31 and a return pipe 32 which communicate with inner bottom portions of the inner vessel 12. The IPA source 30 supplies the inner vessel 12 with liquid IPA 6 of a room temperature through the supply pipe 31, and collects IPA 6 from the vessel 12 through the return pipe 32. The IPA source 30 includes a flow control valve (not shown) and a separation filter (not shown) for separating moisture from IPA 6. The separated moisture is exhausted to the outside through a drain pipe (not shown).

A liquid surface display pipe 36 communicates with an inner bottom portion of the inner vessel 12 for indicating the position of the liquid surface 6a of IPA 6 on its vertical portion. The vertical portion of the pipe 36 is made of a transparent material, and has lower and upper optical sensors 36a and 36b for detecting the liquid surface 6a. The optical sensors 36a and 36b are located corresponding to the lower and upper limit levels of the liquid surface 6a. Each of the optical sensors 36a and 36b has a light emitting element and a light receiving element which are connected to an input section of a control unit 40. When the lower sensor 36a has detected the liquid surface 6a of IPA 6, the control unit 40 supplies a signal to the IPA source 30 to make the same to collect IPA 6 from the inner vessel 12.

A first heat exchanger tube 17 is provided just above the inner bottom of the inner vessel 12. It is preferable to locate the heat exchanger tube 17 in liquid IPA 6 about 5 cm lower than an optimal level of the liquid surface 6a. The first exchanger tube 17 is made of quartz glass or stainless steel.

As is shown in FIG. 2, an upstream side portion 17a of the tube 17 communicates with a supply side portion of a heat medium source 20. The heat medium source 20 contains saturated steam or supersaturated steam which serves as a heating medium. The temperature of the steam is controlled within a range of 120° to 140° C., preferably set to about 130° C. A ball valve 38 is provided across an appropriate portion of the upstream portion 17a. A motor 37 has a driving shaft thereof connected to an opening/closing portion of the valve 38, and a power switch thereof connected to the output terminal of the control unit 40. On the other hand, the downstream portion 17b of the first heat exchanger tube 17 communicates with another heat exchange unit (not shown).

As is shown in FIG. 3, the first heat exchanger tube 17 extends in a zigzag manner along the inner bottom surface of the inner vessel 12. The tube 17 may have other shapes such as a linear shape, a U-shape, a coiled shape, etc. Further, the tube 17 may have, if necessary, a multiple of fins on its outer periphery. The tube 17 is made of quartz glass or stainless steel, and has an outer diameter of 10 to 20 mm, an inner diameter of 8 to 18 mm, and a thickness of 1 to 2 mm.

An annular gutter 22 is provided such that it surrounds the upper opening of the inner vessel 12, and receives a second heat exchanger tube 21 which is in the form of a coil. The second heat exchanger tube 21 has a function for cooling and condensing IPA vapor which flows into the gutter 22 through an inner opening 22a. The drain pipe 22b of the gutter 22 is attached along the upper inner wall of the inner vessel 12. The condensed liquid IPA is passed through the drain pipe 22b over the inner wall of the vessel 12, and returned to the bottom. Moreover, a bent portion 22c of the gutter 22 opens to the outside of the inner vessel 12. On the other hand, an exhaustion passage 61 which communicates with an exhaustion device 60 opens through a side wall portion of the outer vessel 11. Extra IPA vapor is exhausted to the outside of the apparatus 10. The exhausted IPA vapor is collected in a collecting vessel (not shown).

The inner passage 21a of the second heat exchanger tube 21 communicates with a coolant source 28 to circulate a coolant therethrough. The coolant source 28 contains water or a special alcohol which serves as the coolant. The second heat exchanger tube 21 is made of quartz glass or stainless steel, and has an outer diameter of 10 to 20 mm, an inner diameter of 9 to 19 mm, and a thickness of 0.5 to 2.5 mm. The coolant source 28 has a heat exchange system (not shown) for cooling the coolant itself.

First and second temperature sensors 23 and 24 are provided in an upper limit portion of the vapor space 15A, i.e., in a condensation region of IPA vapor. The sensors 23 and 24 are connected to the control unit 40. The threshold value of detection of these sensors 23 and 24 is set, for example, to 70° C. which is lower than the boiling point of IPA. The detection end of the first temperature sensor 23 is located in a lower portion of the IPA vapor condensation region, while that of the second temperature sensor 24 is located in a higher portion of the region. Specifically, the detection end of the second sensor 24 is located 4 to 6 cm above the detection end of the first sensor 23.

Moreover, a third temperature sensor 25 is provided in the upper space 15B for detecting an abnormality, and connected to a fire alarm (not shown) and an automatic fire extinguisher (not shown) via the control unit 40. The automatic fire extinguisher has a function for abruptly exhausting IPA from the inner vessel 12, and applying a fire extinguishing agent gas.

A plurality of lamps 71 are provided on upper inner wall portions of the outer vessel 11 such that they are not exposed to IPA vapor. The lamps 71 radiate infrared rays onto wafers W to dry them while they pass the upper space 15B. Each lamp 71 is backed up by a reflector plate 72. To dry the wafers W, nozzles may be provided in place of the lamps 71 for blowing a clean dry gas onto them.

Referring then to FIGS. 4, 5, 6A to 6E, 7A and 7B, an explanation will be given of the manner of drying a multiple of wet wafers W by means of the apparatus 10 constructed as above.

A predetermined amount of IPA 6 is supplied into the treatment vessel 12 (step S1). As is shown in FIGS. 6A and 6E, when the control unit 40 has received a supply termination signal $S_p$, it generates a control signal $S_0$ to the motor 37. As is shown in FIGS. 6B and 6E, upon receiving the control signal $S_0$, the motor 37 controls the opening of the valve 38 up to 20% to 30%, thereby supplying steam to the first heat exchanger tube 17 to heat IPA 6 in the treatment vessel 12 and keep the heating state (step S2). After a predetermined period of time passes, IPA 6 is warmed and a little evaporated. In this state, treatment can be performed.

The wafers W already cleaned are loaded in the boat 82. When the boat 82 has started to move downward, a trigger signal $S_L$ is supplied to the control unit 40. As is shown in FIGS. 6A and 6E, upon receiving the trigger signal $S_L$ (step S21), the control unit 40 generates a command signal $S_{90}$ to the motor 37 (step S22), which, in turn, increases the opening of the valve 38 from 20–30% to 90% to thereby increase the amount of steam supplied to the first heat exchanger tube 17, as is shown in FIGS. 6B and 6E.

The shutters 51 are opened (step S3), the wafer boat 82 is inserted into the apparatus 10 (step S4), and the shutters are closed (step S5). The wafer boat 82 is placed on the pan 19, thereby exposing the wafers W to IPA vapor in the space 15A (step S6).

Since the opening of the valve 38 is controlled to 90%. Therefore, heating of IPA 6 is accelerated, the amount of IPA vapor is increased, and moisture on the surfaces of the wafers is completely replaced with IPA. The moisture is received in the pan 19 and exhausted to the outside of the apparatus through the passage 33. On the other hand, the second heat exchanger tube 21 condenses IPA vapor 6v, and returns the condensed IPA 6 to the bottom of the vessel 12 through the gutter 22. The control unit 40 continues to generate the instruction signal Sc1 until it receives a signal $S_u$ (steps S25 and 26).

When a great amount of IPA vapor 6v generated with the valve opening of 90% has reached the detection end portion of the temperature sensor 24 as shown in FIG. 7B, the sensor 24 detects a change in temperature and supplies a detection signal Sd1 to the control unit 40 (step S23). As is shown in FIGS. 6B and 6C, upon receiving the signal Sd1, the control unit 40 generates a command signal Sc1 to the motor 37 (step S24 and S25). As a result, the motor 37 is driven to reduce the opening of the valve 38 from 90% to a predetermined value within range of between 50% and 89%. Since at this time, the amount of IPA vapor 6v decreases, the layer of IPA vapor 6v gradually shrinks. When the position of IPA vapor 6v has become lower than the detection end portion of the temperature sensor 23 as shown in FIG. 7A, the sensor 23 detects a change in temperature and supplies a detection signal Sd2 to the control unit 40. As is shown in FIGS. 6B and 6D, upon receiving the signal Sd2 (step S24), the control unit 40 generates the command signal $S_{90}$ to the motor 37 (step S22). As a result, the motor 37 is driven to increase the opening of the valve 38 from the predetermined value within range of between 50% and 89% to 90%, as is shown in FIG. 6E. This processing is repeated during the treatment period T1, so as to adjust the upper end of the IPA vapor layer 6v between the detection end portion of the temperature sensor 23 and that of the temperature sensor 24.

When the treatment of the wafers W using IPA vapor 6v has been finished, the wafer boat 82 starts to be raised. At this time, a trigger signal $S_U$ is supplied to the control unit 40. Upon receiving the trigger signal $S_U$ (step S26), the control unit 40 generates an instruction signal S0 to the motor (step S27). Upon receiving the instruction signal S0, the motor reduces the opening of the valve 38 to 20 to 30% to reduce the degree of heating of IPA 6 (step S8).

The wafer boat 82 is temporarily stopped in the upper space 15B. In this state, the gas in the space 15B is exhausted (step S9), and the lamp 71 is lighted to dry the wafers W in the boat (step S10). Then, the shutter 51 is opened (step S11), the wafers W are transferred out of the apparatus 10 (step S12), and the shutter 51 is closed (step S13).

Since in the above-described apparatus, IPA is directly heated by the first heat exchanger, IPA can react quickly after the start of heating, and a great amount of IPA vapor can be quickly generated. Accordingly, the treatment time period T1 can be shortened, thereby significantly increasing the throughput. In FIG. 6E, a period $T_0$ is a preparation period in which IPA is warmed up with a valve opening of 20 to 30%, and a period $T_2$ is a period in which IPA 6 is heated with a valve opening of 50 to 89%.

Moreover, since the heat transfer area of the first heat exchanger tube 17 can be further increased with ease, IPA 6 can be heated more efficiently. Since saturated steam of about 130° C. is used as the heat medium in the first heat exchanger tube 17, the tube 17 is almost free from fire and safe.

In addition, since the steam valve 38 is controlled in a feedback manner by means of the two temperature sensors 23 and 24 and the control unit 40, the generation amount of IPA vapor can be promptly and finely changed, thereby further shortening the time required to the drying treatment.

Although in the embodiment, the two temperature sensors 23 and 24 are provided in the condensation area of IPA vapor, only a single temperature sensor or a multiple of temperature sensor may be used there. The heat medium flow adjusting valve 38 is not limited to the motor-driven ball valve.

Although in the embodiment, the treatment vessel 2 and the first heat exchanger 17 are made of quartz glass or stainless steel, they may be made of other materials if the materials hardly elute impurities. Furthermore, although the heating apparatus employed in the embodiment is used to dry the semiconductor wafers, it is also applicable to drying LCD substrates.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate drying apparatus for drying a plurality of wet substrates at a time, comprising:

a treatment vessel for containing an organic solvent in the form of liquid and having a boiling point lower than water;

supply means for supplying the organic solvent into the treatment vessel;

a first heat exchanger equipped with a first heat exchange tube dipped in the organic solvent and allowing a heat medium to pass therein, the first heat exchanger allowing the heat medium and the organic solvent to perform heat exchange therebetween to thereby evaporate the organic solvent;

a second heat exchanger provided on or above an upper portion of the treatment vessel and equipped with a second heat exchange tube for allowing a coolant to pass therein, the second heat exchanger allowing the coolant and the evaporated organic solvent to perform heat exchange therebetween to thereby condense the evaporated organic solvent;

a flow adjusting mechanism for adjusting the flow of the heat medium flowing through the first heat exchanger;

temperature sensor means for detecting the temperature of a region in which the organic solvent is evaporated;

control means responsive to a detection signal from the temperature sensor means for controlling the flow adjusting mechanism, the control means controlling the flow adjusting mechanism on the basis of the detection signal from the temperature sensor means to increase or decrease the flow of the heat medium so as to increase or decrease the amount of evaporation of the organic solvent;

a pan situated in the vessel so as not to be dipped in the organic solvent in the form of liquid, for receiving moisture removed from the substrates;

an exhaustion passage communicating with the pan for discharging the removed moisture to the outside of the apparatus; and exhaustion means for exhausting a region above the region in which the organic solvent is evaporated.

2. The apparatus according to claim 1, wherein the flow adjusting mechanism is provided with a ball valve driven by a motor for varying the flow of the heat medium which passes through the first heat exchanger tube.

3. The apparatus according to claim 1, wherein a semiconductor wafer or a glass plate for Liquid Crystal Display is used as the substrate to be dried, and isoprophyl alcohol is used as the organic solvent.

4. The apparatus according to claim 1, wherein saturated steam or supersaturated steam is used as the heat medium.

5. The apparatus according to claim 1, further comprising means for forcibly evaporating that part of the organic solvent which is adhered to the substrates, in a region above a region in which the organic solvent is evaporated.

6. The apparatus according to claim 1, wherein the vessel is made of quartz glass or stainless steel.

7. The apparatus according to claim 1, wherein the first heat exchanger tube is made of quartz glass or stainless steel.

8. The apparatus according to claim 1, wherein the second heat exchanger tube is made of quartz glass or stainless steel.

9. The apparatus according to claim 1, further comprising a gutter for returning to a bottom portion of the vessel the organic solvent condensed by the second heat exchanger.

10. The apparatus according to claim 1, further comprising transfer means for transferring the substrates between a region in which the organic solvent is evaporated and a region above the former.

11. The apparatus according to claim 1, wherein the temperature sensor means includes a first temperature sensor located in the vicinity of the second heat exchange tube, and a second temperature sensor located above the first temperature sensor; and the control means controls, when the first temperature sensor detects a change in temperature, the flow adjusting mechanism so as to increase the amount of the heat medium supplied into the first heat exchange tube and thereby more intensely heat the organic solvent in the treatment vessel, and controls, when the second temperature sensor detects a change in temperature, the flow adjusting mechanism so as to decrease the amount of heat medium supplied into the first heat exchange tube and thereby less intensely heat the organic solvent in the treatment vessel.

12. The apparatus according to claim 1, wherein the heat medium flowing through the first heat exchange tube is saturated vapor or super-saturated vapor having a temperature thereof controlled to a value falling within a range of 90°–150° degrees Celsius.

13. The apparatus according to claim 1, wherein the outer surface of the treatment vessel is covered with a heat insulating member.

14. The apparatus according to claim 1, further comprising liquid surface detection means for detecting the surface position of the organic solvent in the treatment vessel.

* * * * *